United States Patent
Merckling et al.

(10) Patent No.: US 9,419,110 B2
(45) Date of Patent: Aug. 16, 2016

(54) METHOD FOR REDUCING CONTACT RESISTANCE IN MOS

(71) Applicant: IMEC VZW, Leuven (BE)

(72) Inventors: Clement Merckling, Evere (BE); Nadine Collaert, Blanden (BE)

(73) Assignee: IMEC VZW, Leuven (BE)

( * ) Notice: Subject to any disclaimer, the term of this patent is extended or adjusted under 35 U.S.C. 154(b) by 0 days.

(21) Appl. No.: 14/938,169

(22) Filed: Nov. 11, 2015

(65) Prior Publication Data

US 2016/0141391 A1    May 19, 2016

(30) Foreign Application Priority Data

Nov. 13, 2014  (EP) .................................... 14193119

(51) Int. Cl.
*H01L 21/20* (2006.01)
*H01L 29/66* (2006.01)
(Continued)

(52) U.S. Cl.
CPC ...... *H01L 29/66795* (2013.01); *H01L 21/0262* (2013.01); *H01L 21/02381* (2013.01); *H01L 21/02455* (2013.01); *H01L 21/02546* (2013.01); *H01L 21/02549* (2013.01); *H01L 21/02658* (2013.01); *H01L 21/02661* (2013.01);
(Continued)

(58) Field of Classification Search
CPC .................. H01L 21/02387; H01L 21/02392; H01L 21/02395; H01L 21/02455; H01L 21/02513

USPC ........................................... 257/289; 438/285
See application file for complete search history.

(56) References Cited

U.S. PATENT DOCUMENTS 6,010,937 A * 1/2000 Karam .............. H01L 21/02381
257/E21.125
8,415,751 B2    4/2013 Mukherjee et al.
(Continued)

FOREIGN PATENT DOCUMENTS

EP        0 329 400 A2    8/1989
WO    2012/148353 A2    11/2012

OTHER PUBLICATIONS

European Search Report, European Patent Application No. 14193119.6 dated Apr. 21, 2015.
(Continued)

*Primary Examiner* — George Fourson, III
(74) *Attorney, Agent, or Firm* — McDonnell Boehnen Hulbert & Berghoff LLP (57) ABSTRACT

A method for growing a III-V semiconductor structure on a $Si_nGe_{1-n}$ substrate, wherein n is from 0 to 1 is provided. The method includes the steps of: (a) bringing a $Si_nGe_{1-n}$ substrate to a high temperature; (b) exposing the area to a group V precursor in a carrier gas for from 5 to 30 min, thereby forming a doped region at said area; (c) bringing the $Si_nGe_{1-n}$ substrate to a low temperature; (d) exposing the doped region to a group III precursor in a carrier gas and to a group V precursor in a carrier gas until a nucleation layer of III-V material of from 5 to 15 nm is formed on the nucleation layer; (e) bringing the $Si_nGe_{1-n}$ substrate to an intermediate temperature; and (f) exposing the nucleation layer to a group III precursor in a carrier gas and to a group V precursor in a carrier gas.

16 Claims, 7 Drawing Sheets

(51) Int. Cl.
  *H01L 29/20* (2006.01)
  *H01L 29/417* (2006.01)
  *H01L 29/78* (2006.01)
  *H01L 21/02* (2006.01)

(52) U.S. Cl.
  CPC .......... *H01L29/20* (2013.01); *H01L 29/41725* (2013.01); *H01L 29/7848* (2013.01); *H01L 21/02387* (2013.01); *H01L 21/02392* (2013.01); *H01L 21/02395* (2013.01); *H01L 21/02513* (2013.01)

(56) References Cited

U.S. PATENT DOCUMENTS

| | | | | |
|---|---|---|---|---|
| 2007/0262296 | A1* | 11/2007 | Bauer | H01L 31/105 257/19 |
| 2009/0068411 | A1* | 3/2009 | Hong | B82Y 10/00 428/172 |
| 2010/0072513 | A1* | 3/2010 | Lourdudoss | H01L 21/0237 257/183 |
| 2010/0156272 | A1* | 6/2010 | Kim | H01J 29/04 313/495 |
| 2010/0263707 | A1* | 10/2010 | Cheong | C30B 23/02 136/244 |
| 2011/0222570 | A1* | 9/2011 | Junesand | H01S 5/021 372/50.1 |
| 2013/0082241 | A1* | 4/2013 | Kub | H01L 27/148 257/21 |
| 2013/0154016 | A1 | 6/2013 | Glass et al. | |
| 2013/0277752 | A1* | 10/2013 | Glass | H01L 21/823821 257/369 |
| 2013/0285017 | A1 | 10/2013 | Le et al. | |
| 2013/0320417 | A1 | 12/2013 | Mukherjee et al. | |
| 2014/0252414 | A1* | 9/2014 | Merckling | H01L 21/02532 257/192 |
| 2015/0279974 | A1* | 10/2015 | Godet | H01L 29/66803 438/283 |
| 2015/0372097 | A1* | 12/2015 | Bao | H01L 29/0607 257/201 |
| 2016/0141391 | A1* | 5/2016 | Merckling | H01L 29/20 257/288 |

OTHER PUBLICATIONS

Wang, G. et al., "Selective Epitaxial Growth of InP in STI Trenches on Off-Axis Si (001) Substrates", ECS Transactions, vol. 27, No. 1, 2010, pp. 959-964.

Jiang, S. et al., "Growth Rate for the Selective Epitaxial Growth of III-V Compounds Inside Submicron Shallow-Trench-Isolation Trenches on Si (001) Substrates by MOVPE: Modeling and Experiments", Journal of Crystal Growth, vol. 391, 2014, pp. 59-63.

Wang, G. et al., "Seletive Area Growth of InP in Shallow-Trench-Isolated Structures on Off-Axis Si(001) Substrates", Journal of the Electrochemical Society, vol. 157, No. 11, 2010, pp. H1023-H1028.

Merckling, C. et al., "Heteroepitaxy of InP on Si(001) by Selective-Area Metal Organic Vapor-Phase Epitaxy in Sub-50 nm Width Trenches: The Role of Nucleation Layer and the Recess Engineering", Journal of Applied Physics, vol. 115, 2014, pp. 023710-1-023710-6.

\* cited by examiner

METHOD FOR REDUCING CONTACT RESISTANCE IN MOS

TECHNICAL FIELD OF THE INVENTION

The present invention relates to the field of semiconductor devices and their construction. In particular it relates to a method for reducing contact resistance in transistors.

BACKGROUND OF THE INVENTION

In order to enable a higher component density on integrated circuits, much effort is invested in decreasing the size of these components.

Currently, industry is striving to reach the 10 nm technology node. In this node, the gate length in transistors may be smaller than 20 nm. Components currently envisioned for this technology node such as Si FinFET and high mobility channel devices need to fulfil stringent requirements concerning their external resistance.

According to the ITRS roadmap edition 2012, the external resistance of these devices will need to be reduced to less than 100 Ω·μm for Ge/III-V and less than 180 Ω·μm for Si.

A large part of the resistance is coming from the contact resistance (contact plug or local interconnect to the source and drain areas).

Typically contact resistivity values down to $10^{-9}$ to $10^{-8}$ $\Omega \cdot \mu m^2$ will be required to fulfil the requirements for high performance.

With the use of SiGe as source or drain material (with a NiSi or Ni(Si)Ge top layer, or even with direct contacting) one is able to achieve much lower contact resistances for both Si pMOS and Ge pMOS than for nMOS devices. For instance, in Ge pMOS, fermi-level pinning around 0.6 eV leads to good ohmic contacts on Ge pMOS, but leads to Schottky barrier contacts on Ge nMOS.

The lowest specific contact resistivities for Ge nMOS have been achieved with MIS (Metal-Insulator-Semiconductor) contacts but even then only $10^{-7}$ $\Omega \cdot \mu m^2$ has been achieved. Next to that, high doping levels of the source and drain areas are difficult to achieve in Ge due to problems with activation of n-type dopants.

In the case of Si nMOS, contact resistivities below $10^{-8}$ $\Omega \mu m^2$ can so far only be achieved when the doping of the source and drain areas is above $10^{20}$ $cm^{-3}$ which is quite challenging in narrow fins devices. Especially nMOS devices, where As (for Si) and P (for Ge) are typical implant species, suffer from amorphization and problematic recrystallization which leads to high junction resistance. Plasma doping to increase conformality and hot implant to reduce amorphization have been put forward as possible solutions. However, all these techniques require a rather complex integration scheme.

US2012/0168877 proposes a device having an electrical contact where the conductive contact material is separated from the source or drain region by a III-V material. Such an arrangement allegedly produces improved current flow in the Si or Ge nMOS. The present inventors have however observed that the resistivity of such an arrangement is disappointingly high. There remains therefore a need in the art for new good MOS arrangements, and especially nMOS arrangements, permitting low contact resistivities.

SUMMARY OF THE INVENTION

The present invention originates from the realization by the inventors that III-V materials do not grow well on either Si or Ge and especially on highly doped Si or Ge, leading to low uniformity and to high defect density in the III-V material. This in turn leads to a disappointingly high contact resistivity for III-V materials grown on $Si_nGe_{1-n}$ substrates.

It is an object of the present invention to provide good methods for growing III-V materials having a low contact resistivity on $Si_nGe_{1-n}$ substrates.

It is an advantage of embodiments of the present invention that the use of damaging implants in the substrate can be avoided while nevertheless achieving sufficient doping of the interface between the substrate and the III-V material to insure low contact resistivity of the III-V material grown thereon.

The above objective is accomplished by a method and device according to the present invention.

In a first aspect, the present invention relates to a method for growing a III-V semiconductor structure on an area of a $Si_nGe_{1-n}$ substrate, wherein n is from 0 to 1, comprising the steps of:

(a) setting the temperature of the $Si_nGe_{1-n}$ substrate between 550 and 750° C. for n<0.5 and between 760 and 950 for n≥0.5, (b) exposing the area to a group V precursor in a carrier gas for from 5 to 30 min, preferably from 10 to 25 min, yet more preferably from 10 to 20 min thereby forming a doped region at said area, (c) setting the temperature of the $Si_nGe_{1-n}$ substrate between 325° C. and 375° C., preferably between 340° C. and 360° C.

(d) exposing the doped region to a group III precursor in a carrier gas and to a group V precursor in a carrier gas until a nucleation layer of III-V material of from 5 to 15 nm, preferably 5 to 10 nm is formed on the doped region, (e) setting the temperature of the $Si_nGe_{1-n}$ substrate between 450° C. and 550° C., (f) exposing the nucleation layer to a group III precursor in a carrier gas and to a group V precursor in a carrier gas, thereby forming the III-V semiconductor structure.

The nucleation layer is preferably a single layer but if more than one layer is formed, their combined thicknesses should be from 5 to 15 nm, preferably 5 to 10 nm.

In embodiments, n may take the value of 0, 1 or an intermediate value.

In embodiments, prior to step (a), a cleaning step may be performed by heating up the substrate 5-10 minutes to a temperature between 550-750° C. for n<0.5 and 760-950 for n≥0.5, at a pressure between 50 and 500 mbar under $H_2$ atmosphere.

In embodiments, the $Si_nGe_{1-n}$ substrate involved in step (a) may be doped/implanted or undoped.

In embodiments, the III-V semiconductor structure may be of an n-type or of a p-type. The present invention is particularly useful for III-V semiconductor of an n-type.

In an embodiment, the III-V semiconductor structure may be selected from InAs (n-type), GaSb (p-type), InSb (p-type) and InGaSb (p-type) structures. Preferably, the III-V semiconductor is InAs. InAs is advantageous because the Fermi level is pinned inside the conduction band of InAs leading to a perfect alignment of both metal and InAs conduction band levels.

In an embodiment, the III-V semiconductor structure may form at least a top layer of a source or a drain in a transistor. For instance, the III-V semiconductor structure may be the source or the drain in the transistor or, alternatively, the $Si_nGe_{1-n}$ substrate (or a SiC substrate) may be a lower part of a source or a drain in the transistor and the III-V semiconductor structure may be a top layer on that lower part.

In an embodiment, the transistor may be a FinFET and the $Si_nGe_{1-n}$ substrate may be a fin of the FinFET.

Figure 10:
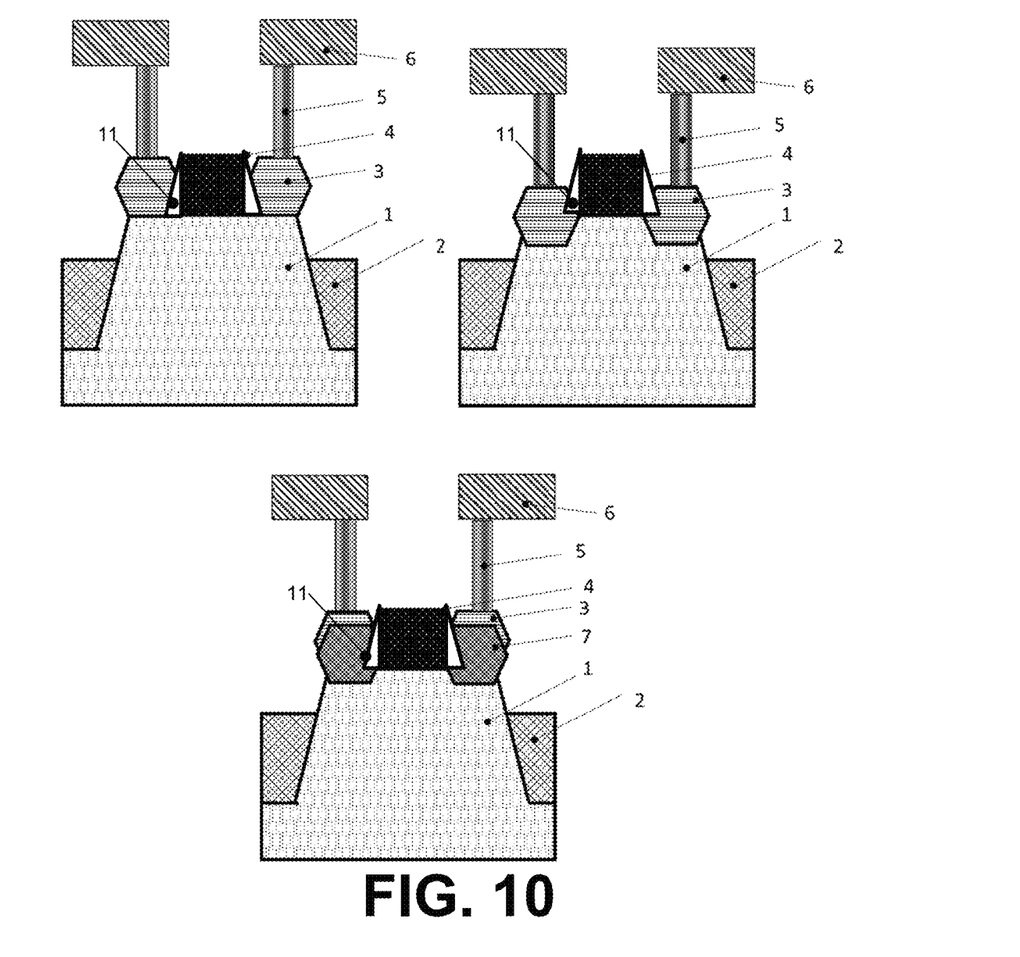
FIG. 10 are schematic representations of different integration schemes for implementing structures according to embodiments of the present invention.

When the III-V semiconductor structure forms at least a top layer of a source or a drain in a transistor, the source and/or the drain may be embedded in the $Si_nGe_{1-n}$ substrate (see FIG. 10 top right) or raised (i.e. not embedded) on the $Si_nGe_{1-n}$ substrate (see FIG. 10 top left).

When the source or drain is said to be embedded in the substrate, this means that the bottom surface of the source or drain is lower than the top surface of the substrate and that the substrate surrounds closely the bottom surface and a bottom part of the side walls of the source or drain. The top surface of the source or drain however is higher than the top surface of the substrate and is not surrounded by the substrate.

When the source or drain is said to be raised on the substrate, this means that the bottom surface of the source or drain is at the same level or higher than the top surface of the substrate.

The temperature in step (a) is preferably set between 800° C. and 900° C. if $n \geq 0.5$.

In embodiments, the group V precursor used in step (b) may be a precursor of As, P or Sb. The precursor can be organic or inorganic. It can have for general formula $MR_3$ wherein M is As, P or Sb and each R is independently selected from the group consisting of H and $C_{1-4}$ alkyl chains. Examples of suitable precursors are tertiarybutylarsine (for As), $AsH_3$ (for As), tert-butylphosphine (for P), trimethylantimony (for Sb), and $SbH_3$ (for Sb).

In embodiments, the group III precursor used in step (d) and/or (f) may be trimethylindium in the case of an In precursor and trimethylgallium in the case of a Ga precursor.

The carrier gases of steps (b), (d) and (f) are preferably hydrogen. A reductive atmosphere is advantageous.

In embodiments, during the performance of step (e), exposure to the group III precursor can be discontinued while exposure to the group V precursor can be maintained. In that case, exposure to the group III precursor can be restarted for the performance of step (f) once the substrate reached the target temperature.

In embodiments, the step (f) of exposing the nucleation layer to a group III precursor in a carrier gas and to a group V precursor in a carrier gas can be performed by using the same precursors as used in step (b).

In embodiments, the doped region may be from 1 to 10 nm deep. This is advantageous because it creates less stress in the surface and it minimizes short channel behaviour.

In embodiments, the doped region may be conformal. This is advantageous as it promotes homogeneous growth of the nucleation layer.

In embodiments, the doping range of the doped region may be from $10^{18}$ to $5 \times 10^{19}$ cm$^{-3}$, preferably from $10^{18}$ to $10^{19}$ cm$^{-3}$. It has surprisingly been found that a doping level within such a relatively low doping range (a typical doping range of the prior art is $10^{20}$-$10^{21}$ cm$^{-3}$) is sufficient to achieve low contact resistivity (below $10^{-8}$ $\Omega \cdot \mu m^2$) for the III-V semiconductor structure. Without being bound by theory, it is believed that a synergy exists between on one hand the low doping level helping depositing a nucleation layer of good quality and on another hand, depositing a nucleation layer according to step (c) and (d) of the present invention permits a low doping level to suffice for achieving highly crystalline III-V structures. An effect of the nucleation layer is to allow uniform growth of the III-V material with a low amount of defects.

In embodiments, the nucleation layer of step (d) may be conformal. This is advantageous as it promotes the homogenous growth of the III-V semiconductor structure.

In embodiments, the III-V semiconductor structure may be a crystal comprising facets. The presence of facets is a signature of the very high crystalline quality surprisingly achieved for the III-V semiconductor structures obtained in the embodiments of the present invention.

In embodiments, anyone of steps (b), (d) and (f) (and preferably all three steps) may be performed by metal organic vapor phase epitaxy. This is advantageous because this method is conformal and operates at lower temperature than e.g. vapor phase deposition.

In embodiments, steps (a)-(f) may be performed in a metal organic vapour phase epitaxy reactor. This permits to perform all steps in situ in the same reactor, thereby limiting sample manipulations and therefore contaminations and damages.

In embodiments, steps (b), (d) and (f) may be performed at a pressure of from 50 to 500 mbars.

In a second aspect, the present invention relates to a device comprising:

a $Si_nGe_{1-n}$ substrate having an area doped with a group V element, a nucleation layer of III-V material of from 5 to 15 nm overlaying the $Si_nGe_{1-n}$ substrate at said area, and a III-V semiconductor structure on said nucleation layer, said III-V semiconductor structure being a crystal comprising facets.

The nucleation layer is preferably a single layer but if more than one layer is formed, their combined thicknesses should be from 5 to 15 nm, preferably 5 to 10 nm.

In this second aspect, the $Si_nGe_{1-n}$ substrate, the features of the doping (nature, conformality, depth . . . ), the group V element, the nucleation layer, the III-V material, and the III-V semiconductor structure may be as defined in any embodiment of the first aspect of the present invention.

In embodiments, the contact resistivity of the III-V semiconductor structure may be below $10^{-8}$ $\Omega \cdot \mu m^2$.

In embodiments, the present invention may relate to a device obtainable by any embodiment of the method of the first aspect of the present invention.

Particular and preferred aspects of the invention are set out in the accompanying independent and dependent claims. Features from the dependent claims may be combined with features of the independent claims and with features of other dependent claims as appropriate and not merely as explicitly set out in the claims.

Although there has been constant improvement, change and evolution of devices in this field, the present concepts are believed to represent substantial new improvements, including departures from prior practices, resulting in the provision of more efficient devices of this nature.

The above and other characteristics, features and advantages of the present invention will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

DESCRIPTION OF ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms "first", "second", "third" and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms "top", "bottom", "over", and "under" and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

Furthermore, some of the embodiments are described herein as a method or combination of elements of a method that can be implemented by a processor of a computer system or by other means of carrying out the function. Thus, a processor with the necessary instructions for carrying out such a method or element of a method forms a means for carrying out the method or element of a method. Furthermore, an element described herein of an apparatus embodiment is an example of a means for carrying out the function performed by the element for the purpose of carrying out the invention.

In the description provided herein, numerous specific details are set forth. However, it is understood that embodiments of the invention may be practiced without these specific details. In other instances, well-known methods, structures and techniques have not been shown in detail in order not to obscure an understanding of this description.

The invention will now be described by a detailed description of several embodiments of the invention. It is clear that other embodiments of the invention can be configured according to the knowledge of persons skilled in the art without departing from the true spirit or technical teaching of the invention, the invention being limited only by the terms of the appended claims.

Reference will be made to transistors. These are three-terminal devices having a first main electrode such as a drain, a second main electrode such as a source and a control electrode such as a gate for controlling the flow of electrical charges between the first and second main electrodes.

Example 1

Figure 1:
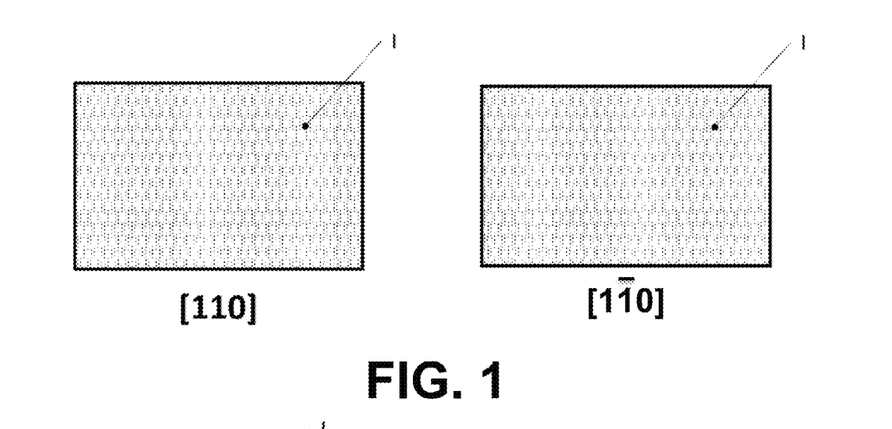
FIGS. 1 to 6 are schematic representations of the end results of steps performed to prepare a sample for the performance of a method according to embodiments of the present invention.

Manufacture of a Si Fin Comprising an Area on which a InAs Source (or Drain) Structure Will be Grown FIG. 1 shows the silicon substrate (1) before formation of the fin. The left side of FIG. 1 shows a cross-section of the substrate (1) perpendicular to the [110] direction. The right side of FIG. 1 shows a cross-section of the substrate (1) perpendicular to the [110] direction which is itself perpendicular to the [110] direction. In the following, the cross-section of the substrate perpendicular to the [110] direction will be referred to as the front cross-sectional view while the cross-section of the substrate perpendicular to the [110] direction will be referred to as the side cross-sectional view.

Figure 2:
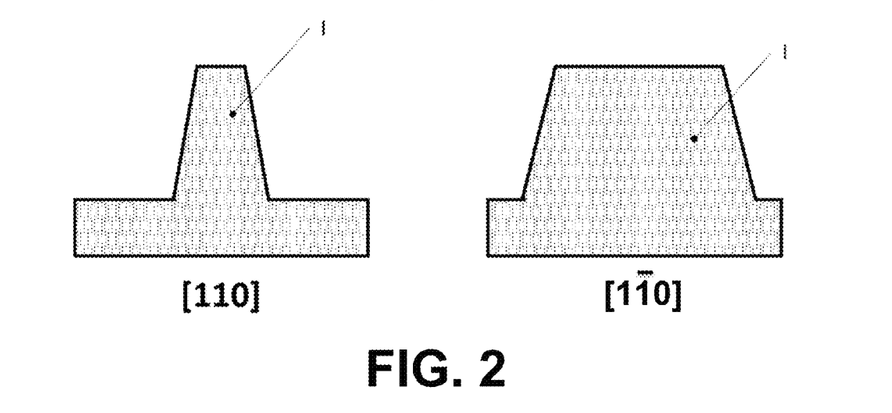

FIG. 2 shows the fin obtained after an etching process operated on the silicon substrate (1). Both cross-sections are cutting in half the area of the substrate where the InAs structure will be grown.

Figure 3:
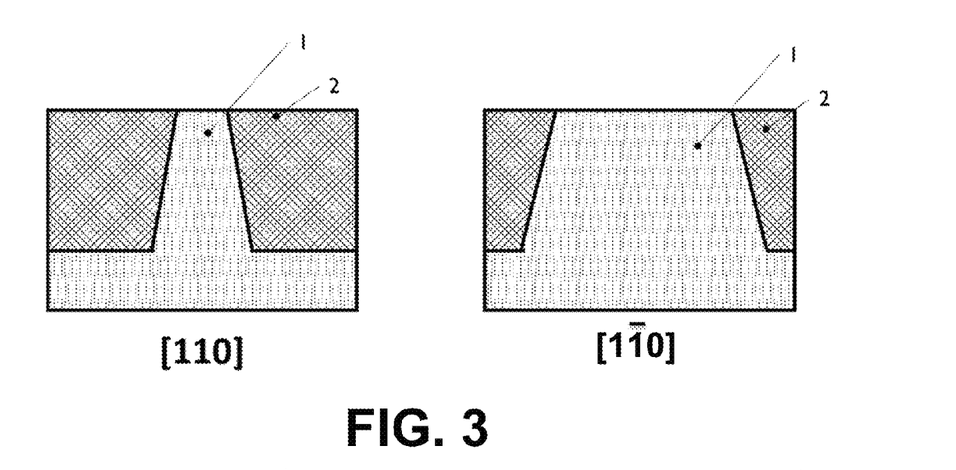

FIG. 3 shows the formation of a shallow trench isolation (STI) by filling trenches present on both sides of the fin with a dielectric material (2) such as $SiO_2$.

Figure 4:
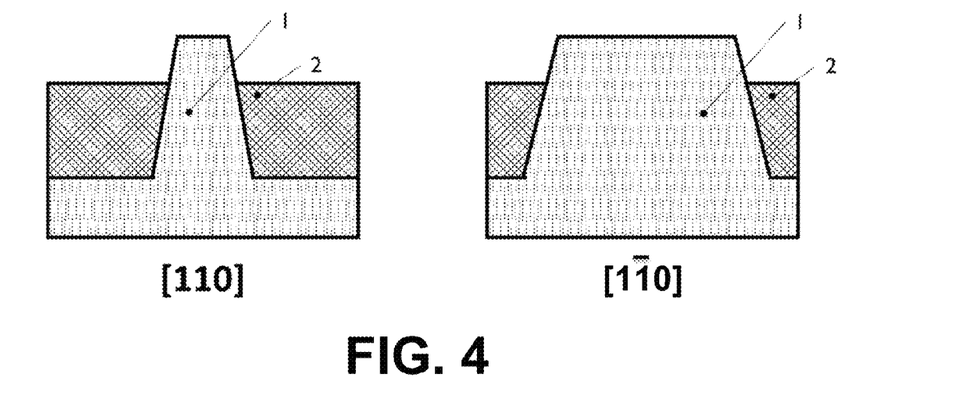

FIG. 4 shows the formation of a recess in the STI so as to uncover a top portion of the fin comprising the area of interest. This can be done by for example wet etch or even a dry etch to recess the STI oxide.

Figure 5:
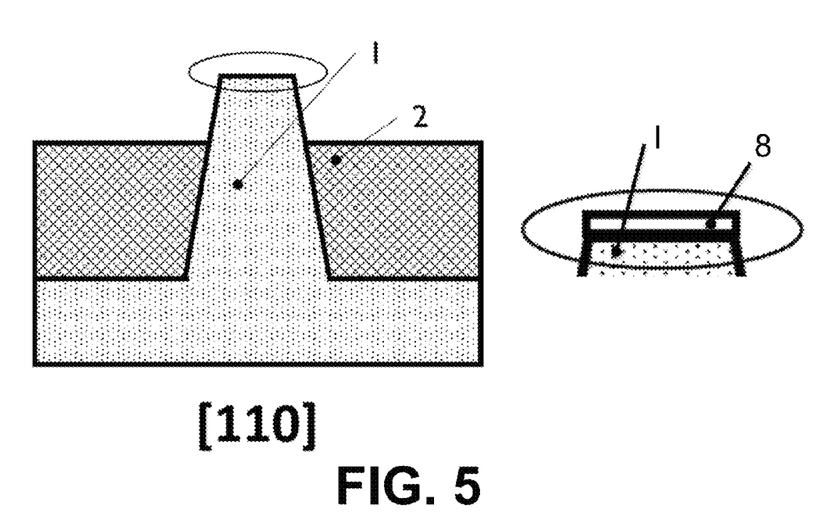

A native oxide layer (8) was present at the top of the fin. This is represented in FIG. 5.

Example 2

Growing of a InAs Source (or Drain) Structure on the Structure of Example 1

The sample of Example 1 was placed in a MOVPE (MetalOrganic Vapor Phase Epitaxy) reactor.

Figure 6:
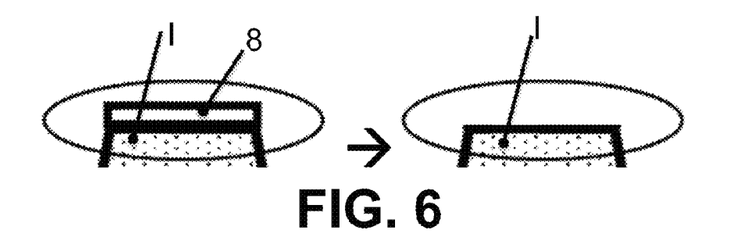

Referring now to FIG. 6, prior to the InAs selective area growth, the surface of the fin was thermally cleaned from its native oxide by heating it up to a temperature of 850° C. under a $H_2$ atmosphere at a pressure of less than 100 mbar for a period of from 5 to 10 min. If the substrate is made of Ge instead of Si, the backing should be performed above 500° C. For an intermediate composition of the substrate ($Si_nGe_{1-n}$), an intermediate temperature is suitable and can be easily determined by trial and errors.

Figure 7:
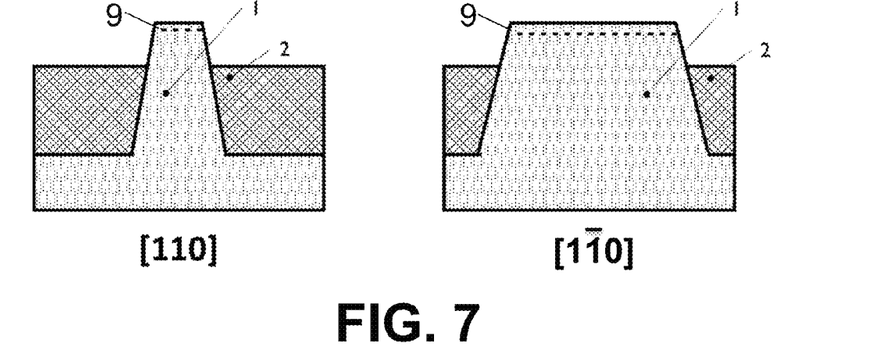
FIG. 7 is a schematic representation of the end result of step (b) in embodiments of the present invention.

Following this bake step, the temperature was kept at the same bake temperature with pressure between 50 mbar and 500 mbar during 15 min to expose the Si surface to tertiarybutylarsine in order to promote the interdiffusion of As into a top portion of the Si fin. Alternatively, $AsH_3$ could also have been used. The end-result is shown in FIG. 7 where the As doping (9) is represented by the sign "-".

Figure 8:
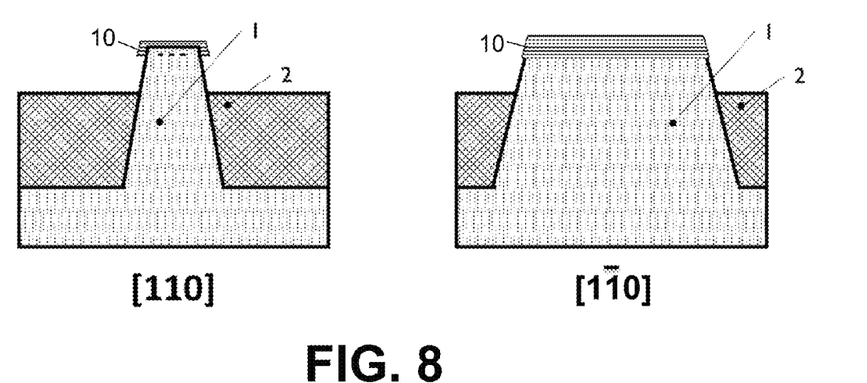
FIG. 8 is a schematic representation of the end result of step (d) in embodiments of the present invention.

After that the temperature was ramped down to the lower temperature of 350° C., the area of interest was exposed simultaneously to both tertiarybutylarsine and trimethylindium until a thickness of InAs of about 5-10 nm was obtained. This is represented in FIG. 8.

Figure 9:
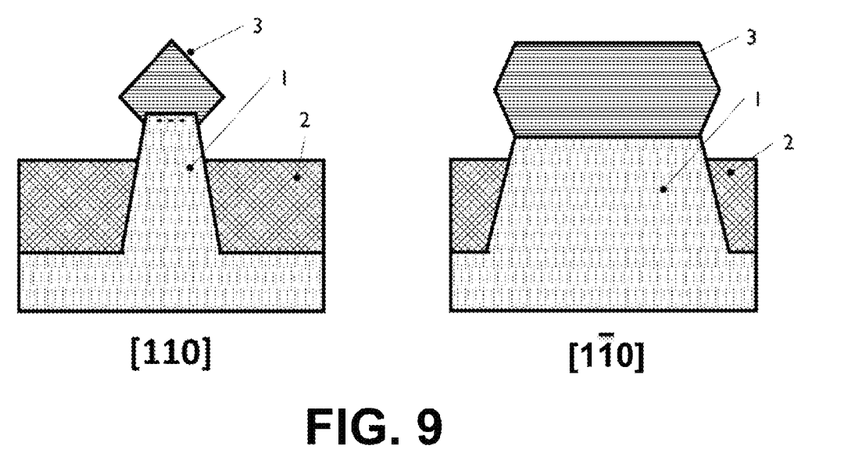
FIG. 9 is a schematic representation of the end result of step (f) in embodiments of the present invention.
Figure 11:
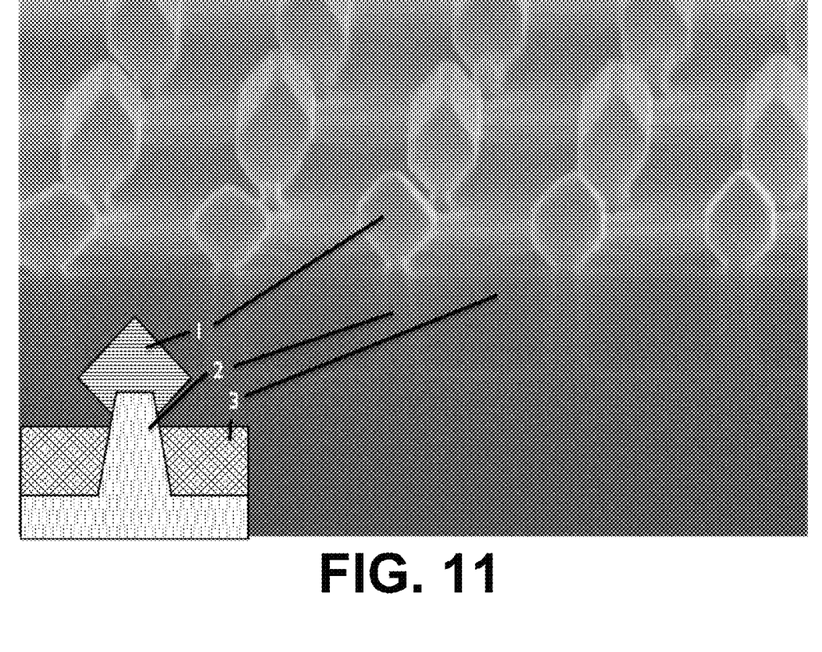
FIG. 11 is a Transmission Electron Microscopy (TEM) picture of embodiments of a device according to the present invention.
Figure 12:
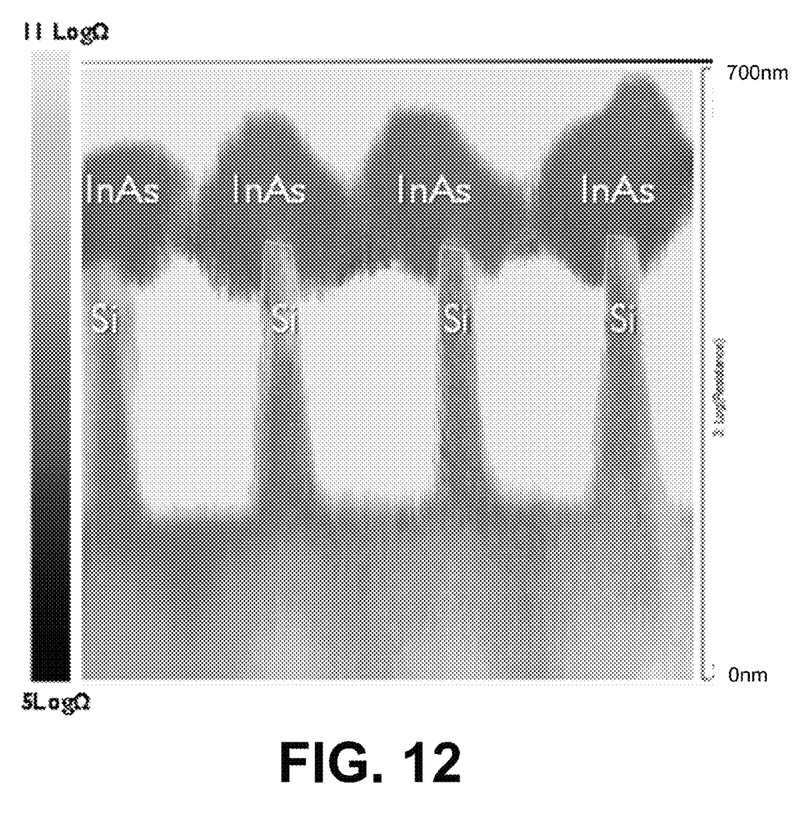
FIG. 12 is a Scanning Spreading Resistance Microscopy image of embodiments of a device according to the present invention.

Finally, as shown in FIG. 9, the temperature was ramped to higher temperatures (450-550° C.) with a reactor pressure range between 50 mbar and 500 mbar in $H_2$ for the main InAs source (or drain) structure growth. The height of the grown structure was about 170 nm above the Si fin level (see FIG. 12 where a Scanning Spreading Resistance Microscopy image is shown; on this image, the height of the fins is about 250 nm and the width of the fins is about 45 nm). The grown InAs structure was of high crystalline quality as confirmed by the formation of facets (see FIG. 11 where a Transmission Electron Microscopy image is shown).

Example 3

Growing of a InAs Layer on a Pre-Formed Source (or Drain) Structure

By a process analog to the one described in Example 2, an InAs (or other III-V) layer can be grown on top of a pre-formed $Si_nGe_{1-n}$ source or drain. For this purpose, the same process of Example 2 can be repeated except that it starts by cleaning the surface of the pre-formed $Si_nGe_{1-n}$ source or drain instead of cleaning the fin. It then proceeds by exposing the source or drain surface to an As precursor, exposing the source or drain at a lower temperature to tertiarybutylarsine and trimethylindium until a thickness of InAs of about 5-10 nm is obtained, and growing a layer of InAs at a higher temperature until the desired height is obtained. In this case, InAs is used to reduce the contact resistance of the pre-existing source/drain.

Example 4

Integration

FIG. 10 shows different integration schemes for implementing the source and drain structures of the present invention. Both raised (top left) and embedded (top right) InAs Source/Drain integration schemes can be considered. In FIG. 10 (top left and right), the side cross-sectional view of a fin structure is represented. On top of the fin (1), an InAs source (3) and an InAs drain (3) are shown separated by a gate structure (4) and spacers (11). W connectors (5) and Cu contacts (6) are electrically connected to the source (3) and drain (3).

In Si nMOS, the InAs layer can also be used as a thin layer (see Example 3 and FIG. 10, bottom) on top of an in-situ doped Si, or Si:C (embedded or raised) source/drain. In Ge nMOS, the InAs layer can be used as a thin layer on top of a Ge or SiGe source/drain.

It is to be understood that although preferred embodiments, specific constructions and configurations, as well as materials, have been discussed herein for devices according to the present invention, various changes or modifications in form and detail may be made without departing from the scope of this invention. Steps may be added or deleted to methods described within the scope of the present invention.

The invention claimed is:

1. A method for growing a III-V semiconductor structure on an area of a $Si_nGe_{1-n}$ substrate, wherein n is from 0 to 1, comprising the steps of:
   (a) setting the temperature of a $Si_nGe_{1-n}$ substrate between 550° C. and 750° C. if n<0.5 and between 760 and 950° C. if n≥0.5;
   (b) exposing an area of the $Si_nGe_{1-n}$ substrate to a group V precursor in a carrier gas for from 5 to 30 min, thereby forming a doped region (9) at said area;
   (c) setting the temperature of the $Si_nGe_{1-n}$ substrate between 325° C. and 375° C.;
   (d) exposing the doped region to a group III precursor in a carrier gas and to a group V precursor in a carrier gas until a nucleation layer of III-V material of from 5 to 15 nm is formed on the doped region;
   (e) setting the temperature of the $Si_nGe_{1-n}$ substrate between 450° C. and 550° C.; and
   (f) exposing the nucleation layer to a group III precursor in a carrier gas and to a group V precursor in a carrier gas, thereby forming a III-V semiconductor structure.

2. The method according to claim 1, wherein the III-V semiconductor structure is InAs.

3. The method according to claim 1, wherein the III-V semiconductor structure forms at least a top layer on a $Si_nGe_{1-n}$ source or a $Si_nGe_{1-n}$ drain wherein n is from 0 to 1 in a transistor.

4. The method according to claim 3, wherein the transistor is a FinFET and wherein the $Si_nGe_{1-n}$ substrate is a fin of the FinFET.

5. The method according to claim 3, wherein the III-V semiconductor structure is the source or the drain in the transistor.

6. The method according to claim 3, wherein the $Si_nGe_{1-n}$ substrate is a lower part of a $Si_nGe_{1-n}$ source or a drain in the transistor and wherein the III-V semiconductor structure is a top layer on the lower part.

7. The method according to claim 1, wherein the temperature in step (a) is set between 850 and 950° C. if n=1.

8. The method according to claim 1, wherein the group V precursor used in step (b) is a precursor of As, P or Sb.

9. The method according to claim 1, wherein the carrier gases of steps (b), (d) and (f) are hydrogen.

10. The method according to claim 1, wherein the doped region is from 1 to 10 nm deep.

11. The method according to claim 1, wherein the doping range of the doped region is from $5\times10^{18}$ to $10^{20}$ $cm^{-3}$.

12. The method according to claim 11 wherein doping range of the doped region is from $5\times10^{18}$ to $10^{19}$ $cm^{-3}$.

13. The method according to claim 1, wherein the III-V semiconductor structure is a crystal comprising facets.

14. The method according to claim 1, wherein steps (b), (d) and (f) are performed by metal organic vapor phase epitaxy.

15. The method according to claim 1, wherein steps (b), (d) and (f) are performed at a pressure of from 50 to 500 mbars.

16. A device comprising:
(a) a $Si_nGe_{1-n}$ substrate having an area doped with a group V element (9),
(b) a nucleation layer of III-V material of from 5 to 15 nm overlaying the $Si_nGe_{1-n}$ substrate at said area, and
(c) a III-V semiconductor structure on said nucleation layer, said III-V semiconductor structure being a crystal comprising facets.

\* \* \* \* \*